United States Patent
Ishiyama

(10) Patent No.: US 7,190,054 B2
(45) Date of Patent: Mar. 13, 2007

(54) SEMICONDUCTOR MODULE HAVING INNER PRESSURE RELEASE PORTION

(75) Inventor: Hiroshi Ishiyama, Chiryu (JP)

(73) Assignee: Denso Corporation, Kariya (JP)

( * ) Notice: Subject to any disclaimer, the term of this patent is extended or adjusted under 35 U.S.C. 154(b) by 104 days.

(21) Appl. No.: 10/778,029

(22) Filed: Feb. 17, 2004

(65) Prior Publication Data

US 2004/0159962 A1 Aug. 19, 2004

(30) Foreign Application Priority Data

Feb. 19, 2003 (JP) ............................. 2003-041343

(51) Int. Cl.
*H01L 23/495* (2006.01)
(52) U.S. Cl. .................. 257/666; 257/676; 257/707
(58) Field of Classification Search ................ 257/683, 257/687, 706, 717, 719, 723, 666, 676, 707; 29/855
See application file for complete search history.

(56) References Cited

U.S. PATENT DOCUMENTS 6,495,924 B2 * 12/2002 Kodama et al. ............ 257/785

| | | | |
|---|---|---|---|
| 6,542,365 B2 | 4/2003 | Inoue | |
| 6,773,964 B2 * | 8/2004 | Fan | ............................. 438/122 |
| 6,845,012 B2 * | 1/2005 | Ohkouchi | .................... 361/704 |
| 2003/0132530 A1 | 7/2003 | Teshima et al. | |

FOREIGN PATENT DOCUMENTS

| JP | A 9-129794 | 5/1997 |
|---|---|---|
| JP | A 9-260585 | 10/1997 |
| JP | A 2001-267469 | 9/2001 |
| JP | A 2001-326310 | 11/2001 |
| JP | A 2001-326324 | 11/2001 |
| JP | A 2001-345589 | 12/2001 |
| JP | A 2002-095267 | 3/2002 |

* cited by examiner

*Primary Examiner*—Theresa T. Doan
(74) *Attorney, Agent, or Firm*—Oliff & Berridge PLC

(57) ABSTRACT

A semiconductor module includes a semiconductor chip having a first surface and a second surface; a first electrode plate contacting the first surface of the semiconductor chip; a second electrode plate contacting the second surface of the semiconductor chip; and a resin mold for sealing the first and second electrode plates and the semiconductor chip. The resin mold includes an inner pressure release portion for releasing a pressure in the resin mold.

21 Claims, 7 Drawing Sheets

SEMICONDUCTOR MODULE HAVING INNER PRESSURE RELEASE PORTION

CROSS REFERENCE TO RELATED APPLICATION

This application is based on Japanese Patent Application No. 2003-41343 filed on Feb. 19, 2003, the disclosure of which is incorporated herein by reference.

FIELD OF THE INVENTION

The present invention relates to a semiconductor module having an inner pressure release portion.

BACKGROUND OF THE INVENTION

In an electric vehicle or a hybrid vehicle, direct current discharged from a battery is converted to alternating current with using an inverter so that an alternating current motor is energized and driven. The inverter includes a plurality of semiconductor modules. Each semiconductor module has a semiconductor device and a pair of electrode plates disposed on both sides of the device. When the semiconductor device is operated, the device generates heat. Therefore, the semiconductor module is required to be cooled with various cooling means so as to reduce the temperature of the device lower than the permissible temperature limit of the device.

In a semiconductor device disclosed in Japanese Unexamined Patent Application Publication No. 2001-308263 (i.e., U.S. Pat. No. 6,542,365), a pair of heat sinks are disposed on both sides of a semiconductor module so that the heat generated in a semiconductor device is radiated to the outside through air-cooling fin of the heat sink. This cooling means using the air-cooling fin for radiating heat to the outside air has a simple construction and is a convenient means. However, a cooling performance, i.e., a cooling efficiency of the cooling means is not sufficient.

In an inverter disclosed in Japanese Unexamined Patent Application Publication No. 2001-345589, a pair of cooling units is disposed on both sides of a semiconductor device. A coolant flows in each cooling unit so that the semiconductor device is cooled. Further, in a cooling unit for cooling electric equipment disclosed in Japanese Unexamined Patent Application Publication No. 2002-95267, a pair of cooling member is disposed on both sides of a semiconductor device. A coolant flows in each cooling member and the device is pressed with a pair of cooling member so that the semiconductor device is cooled.

In the cooling means above, the heat generated in the semiconductor device is absorbed (i.e., heat-exchanged) by the coolant flowing through the cooling unit or the cooling member. However, inner pressure in and/or around the semiconductor device is increased extremely, to a degree that the semiconductor device or the inverter structure may be broken. Specifically, if anomaly happens in the semiconductor device (e.g., an excess current flow in the device, the excess current larger than the permissible limit), extreme heat is generated in the device. Then, a resin mold disposed around the device melts and vaporizes, so that an inner pressure inside the device is increased extremely. Therefore, the increased inner pressure pushes electrode plates of the device outward, while the electrode plates are sealed with the resin mold. If the electrode plate is deformed largely, the cooling member or the cooling unit may be destroyed, and/or the coolant may leak to the outside. Further, the whole semiconductor module may be destroyed, scattering pieces of the resin mold around the module, which in turn damage other parts of the equipment.

SUMMARY OF THE INVENTION

In view of the above problem, it is an object of the present invention to provide a semiconductor module having safety feature for preventing an extreme increase of inner pressure of the module.

A semiconductor module includes a semiconductor chip having a first surface and a second surface; a first electrode plate contacting the first surface of the semiconductor chip; a second electrode plate contacting the second surface of the semiconductor chip; and a resin mold for sealing the first and second electrode plates and the semiconductor chip. The resin mold includes an inner pressure release portion for releasing inner pressure of the resin mold.

In the module above, the inner pressure is released to the outside of the module using the inner pressure release portion, therefore the inner pressure in the module is sufficiently reduced. Thus, the module has a safety feature for preventing an extreme increase of the pressure inside the module.

Preferably, the inner pressure release portion is made of resin material having low adhesiveness to the resin mold. And the inner pressure release portion is a resin rod embedded in the resin mold. More preferably, the resin mold includes a hole, and the resin rod is inserted into the hole of the resin mold. The resin rod is removable from the hole so that a clearance is formed between the resin rod and the hole.

In the module above, the inner pressure release portion works in such a manner that the pressure in the resin mold is released through the clearance between the resin rod and the hole.

Further, a semiconductor module includes a semiconductor chip having a first surface and a second surface; a first electrode plate contacting the first surface of the semiconductor chip; a second electrode plate contacting the second surface of the semiconductor chip; and a resin mold for sealing the first and second electrode plates and the semiconductor chip. Each of the first and second electrode plates includes an inner pressure release portion for releasing inner pressure of the resin mold.

In the module above, the inner pressure is released to the outside of the module using the inner pressure release portion, so that the pressure in the module is sufficiently reduced. Thus, the module has a safety feature for preventing an extreme increase of the inner pressure of the module.

Preferably, the inner pressure release portion is a starting point for deform action of the first and second electrode plates so that the inner pressure is released. More preferably, each of the first and second electrode plates includes the starting point and another portion. The other portion is deformable so that a clearance is formed between the other portion and the resin mold.

In the module above, the inner pressure release portion works in such a manner that the inner pressure of the resin mold is released through the clearance.

BRIEF DESCRIPTION OF THE DRAWINGS

The objects, features and advantages of the present invention mentioned above and elsewhere will become more apparent from the following detailed description made with reference to the accompanying drawings. In the drawings.

Figure 1:
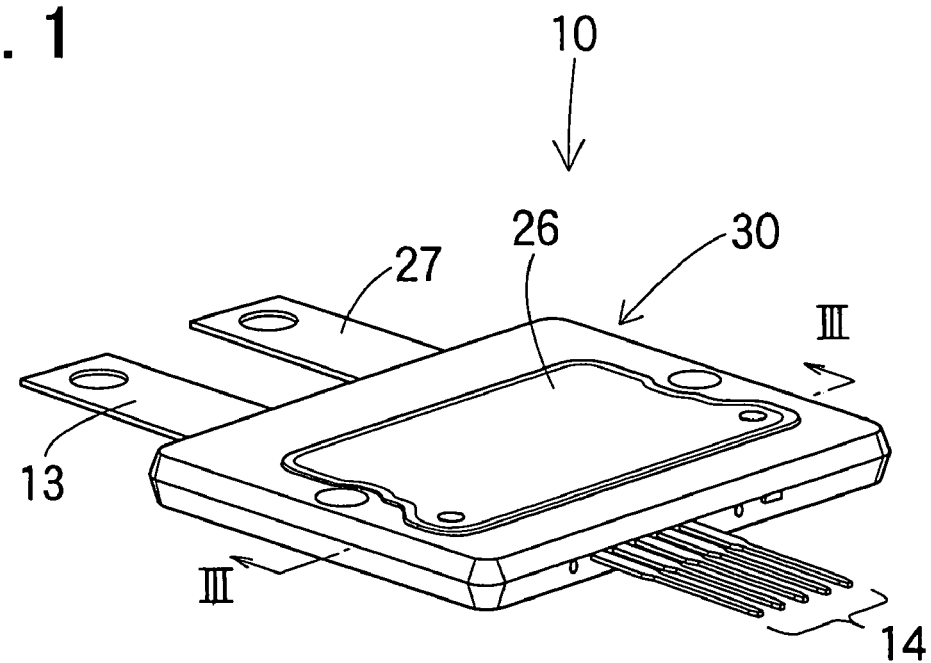
FIG. 1 is a schematic perspective view showing a semiconductor module according to a first embodiment of the present invention.

DETAILED DESCRIPTION OF THE PREFERRED EMBODIMENTS (First Embodiment)

A semiconductor module 10 according to a first embodiment of the present invention is shown in FIGS. 1–5. The module 10 includes the first semiconductor chip 17, the second semiconductor chip 20, a lower electrode plate 11, an upper electrode plate 25 and a resin mold 30. The first and second semiconductor chips 17, 20 are disposed in parallel. Both lower sides of the first and second semiconductor chips 17, 20 are disposed on and contact the lower electrode plate 11, and both upper sides of the first and second semiconductor chips 17, 20 contact the upper electrode plate 25. The resin mold 30 seals and holds two semiconductor chips 17, 20 and a pair of electrode plates 11, 25.

The lower electrode plate 11 has a rectangular shape, and is made of copper-based material. The lower electrode plate 11 includes a body 12, a collector electrode 13 and a plurality of terminals 14. The collector electrode 13 extrudes from the module 10 toward one side of the module 10. The terminals 14 extrude from the module 10 toward the other side of the module 10, which is opposite to the collector electrode 13. A gate signal and an emitter signal are inputted into the module, while a current mirror signal and a temperature sensor signal are outputted from the module 10 through the terminals 14. The temperature sensor signal is derived from a temperature characteristic of forward voltage of a diode.

The first semiconductor chip 17 as a switching device and the second semiconductor chip 20 as a commutation device are disposed on the lower electrode plate 11. The first semiconductor chip 17 is an IGBT (i.e., an insulated gate bipolar transistor), and the second semiconductor chip 20 is a diode, and connects to the lower electrode plate 11 with solder 22a, 22b, respectively. The first semiconductor chip 17 and the terminals 14 are wire-bonded with a plurality of wires 23.

The upper electrode plate 25 is disposed on the first and second semiconductor chips 17, 20 through a block (not shown). The block prevents the wire 23 from contacting the upper electrode plate 25. The upper electrode plate 25 is made of copper based material, and includes a body 26 and an emitter electrode 27. The emitter electrode 27 extrudes from the module 10 toward the one side of the module 10, which is the same side as the side to which the collector electrode 13 extrudes. Each of the first and second semiconductor chips 17, 20 connects to the upper electrode plate 25 with solder 28a, 28b, respectively.

The collector electrode 13 and the emitter electrode 27 conducts main current through the first and second semiconductor chips 17, 20.

The resin mold 30 seals and holds two semiconductor chips 17, 20 and a pair of electrode plates 11, 25. The resin mold 30 includes a filling portion 31, a periphery portion 35, a lower portion 41 and an upper portion 43. The filling portion 31 fills a clearance between the first and second semiconductor chips 17, 20. The periphery portion 35 is disposed on a periphery of the first and second semiconductor chips 17, 20. The lower portion 41 is disposed on a lower side of the lower electrode plate 11. The upper portion 43 is disposed on an upper side of the upper electrode plate 25.

The filling portion 31 includes a plurality of portions 32a, 32b, 33a, 33b, which are disposed on the collector electrode 13 side, the terminal 14 side that is opposite to the collector electrode 13 side, the first semiconductor chip 17 side, and the second semiconductor chip 20 side that is opposite to the first semiconductor chip 17 side, respectively. The periphery portion 35 includes a plurality of portions 36a, 36b, 37a, 37b, which are disposed on the outside of the portions 32a, 32b, 33a, 33b, respectively. Specifically, the portion 36a is disposed on the collector electrode 13 side, the portion 36b is disposed on the terminal 14 side that is opposite to the collector electrode 13 side, the portion 37a is disposed on the first semiconductor chip 17 side, and the portion 37b is disposed on the second semiconductor chip 20 side that is opposite to the first semiconductor chip 17 side.

The body 12 of the lower electrode plate 11 is exposed on the bottom surface of the lower portion 41 of the resin mold 30. The body 26 of the upper electrode plate 25 is exposed on the top surface of the upper portion 43 of the resin mold 30.

Figure 2:
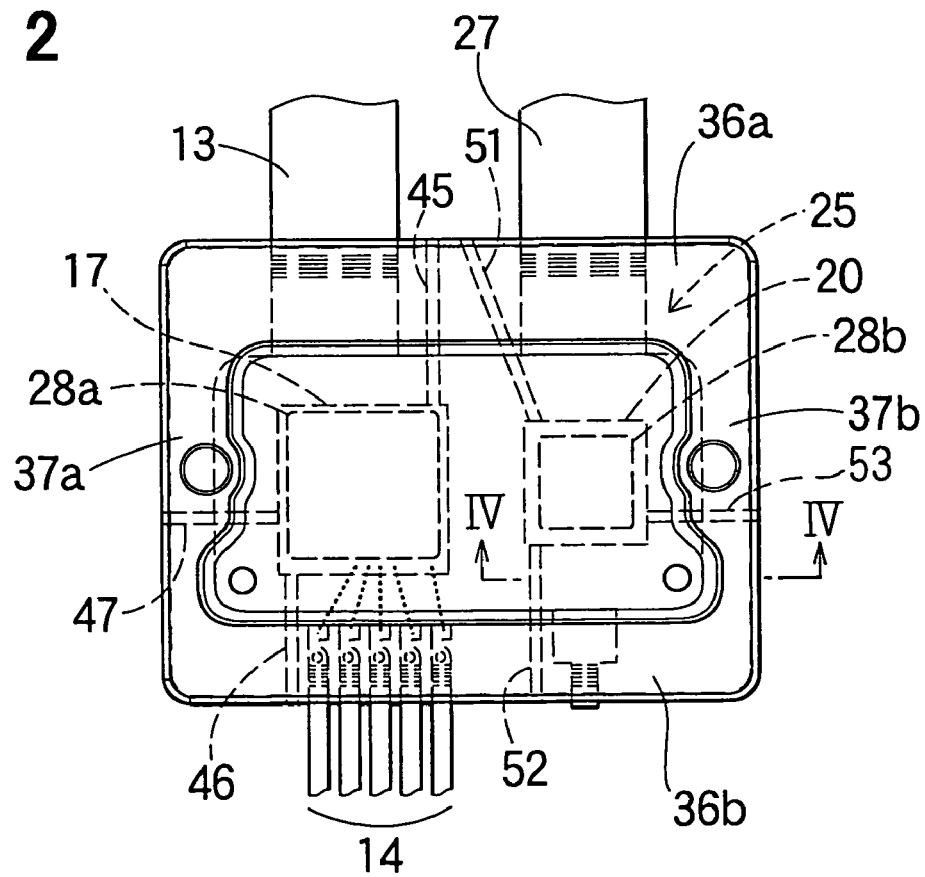
FIG. 2 is a plan view showing the module according to the first embodiment.
Figure 3:
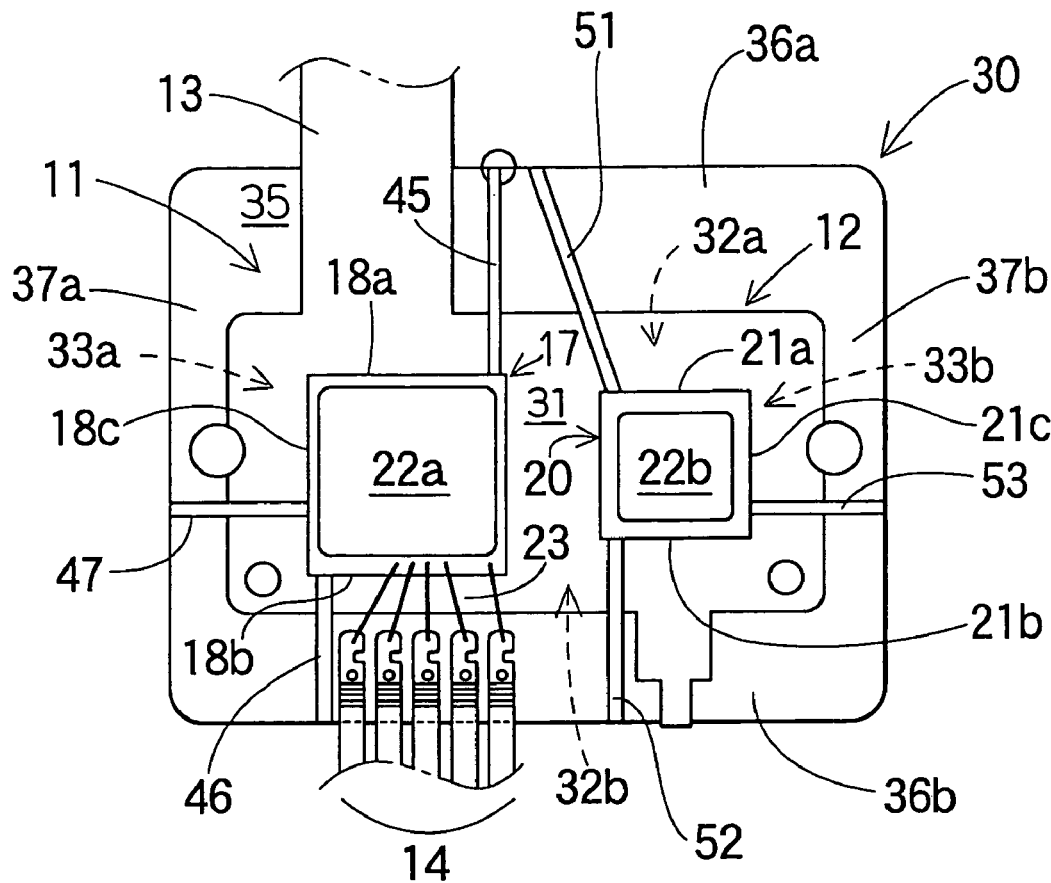
FIG. 3 is a cross-sectional view showing the module cut along the line III—III in FIG. 1.
Figure 4:
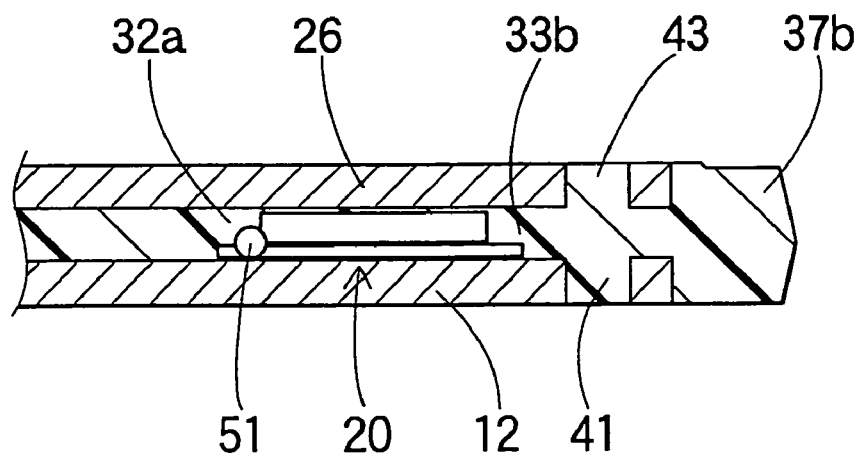
FIG. 4 is a partial cross-sectional view showing the module cut along the line IV—IV in FIG. 2.

As shown in FIGS. 2 and 3, the first resin rod 45 as an inner pressure release portion is embedded in the portions 32a, 36a of the resin mold 30 disposed on the collector electrode 13 side. The first resin rod 45 extends from one periphery 18a of the first semiconductor chip 17 to the outer periphery of the portion 36a of the resin mold 30, i.e., the first resin rod 45 extends from the surface of the first semiconductor chip 17 to the outside of the resin mold 30. Here, the one periphery 18a of the first semiconductor chip 17 is disposed on the collector electrode 13 side.

The second resin rod 46 is embedded in the portions 32b, 36b of the resin mold 30 disposed on the terminal 14 side. The second resin rod 46 extends from the other periphery 18b of the first semiconductor chip 17 to the outer periphery of the portion 36b of the resin mold 30. The other periphery 18b of the first semiconductor chip 17 is disposed on the terminal 14 side, which is opposite to the collector electrode 13 side.

The third resin rod 47 is embedded in the portions 33a, 37a of the resin mold 30 disposed on the first semiconductor chip 17 side. The third resin rod 47 extends from yet another periphery 18c of the first semiconductor chip 17 to the outer periphery of the portion 37a of the resin mold 30. The yet another periphery 18c of the first semiconductor chip 17 is disposed on the left side of the first semiconductor chip 17.

The first, the second and the third resin rods 45–47 are made of resin material which has a melting point a little higher than that of the resin material composing the resin mold 30. After each of the first, the second and the third rods 45–47 is preliminarily positioned between the first semiconductor chip 17 and the lower electrode plate 11, the resin mold 30 is formed so that the rods 45–47 are positioned in a predetermined manner.

The fourth resin rod 51 is embedded in the portions 32a, 36a of the resin mold 30 disposed on the collector electrode 13 side. The fourth resin rod 51 extends from one periphery 21a of the second semiconductor chip 20 to the outer periphery of the portion 36a of the resin mold 30, i.e., the fourth resin rod 51 extends from the edge of the second semiconductor chip 20 to the outside of the resin mold 30. The one periphery 21a of the second semiconductor chip 20 is disposed on the collector electrode 13 side. The fourth resin rod 51 slants toward the first resin rod 45.

The fifth resin rod 52 is embedded in the portions 32b, 36b of the resin mold 30 disposed on the terminal 14 side. The fifth resin rod 52 extends from the other periphery 21b of the second semiconductor chip 20 to the outer periphery of the portion 36b of the resin mold 30. The other periphery 21b of the second semiconductor chip 20 is disposed on the terminal 14 side, which is opposite to the collector electrode 13 side. The fifth resin rod 52 is parallel to the second resin rod 46.

The sixth resin rod 53 is embedded in the portions 33b, 37b of the resin mold 30 disposed on the second semiconductor chip 20 side. The sixth resin rod 53 extends from yet another periphery 21c of the second semiconductor chip 20 to the outer periphery of the portion 37b of the resin mold 30. The yet another periphery 21c of the second semiconductor chip 20 is disposed on the right side of the second semiconductor chip 20. The sixth resin rod 53 is disposed on the opposite side of the third resin rod 47.

The fourth, the fifth and the sixth resin rods 51–53 are made of resin material, which has a melting point a little higher than that of the resin material composing the resin mold 30. After each of the fourth, the fifth and the sixth rods 51–53 is preliminarily positioned between the second semiconductor chip 20 and the lower electrode plate 11, the resin mold 30 is formed so that the rods 51–53 are positioned in a predetermined manner.

Preferably, the resin rods 45–47, 51–53 are made of resin material having low adhesiveness to the resin mold 30. Specifically, the resin rods 45–47, 51–53 do not adhere to the resin mold 30 strongly.

Figure 5:
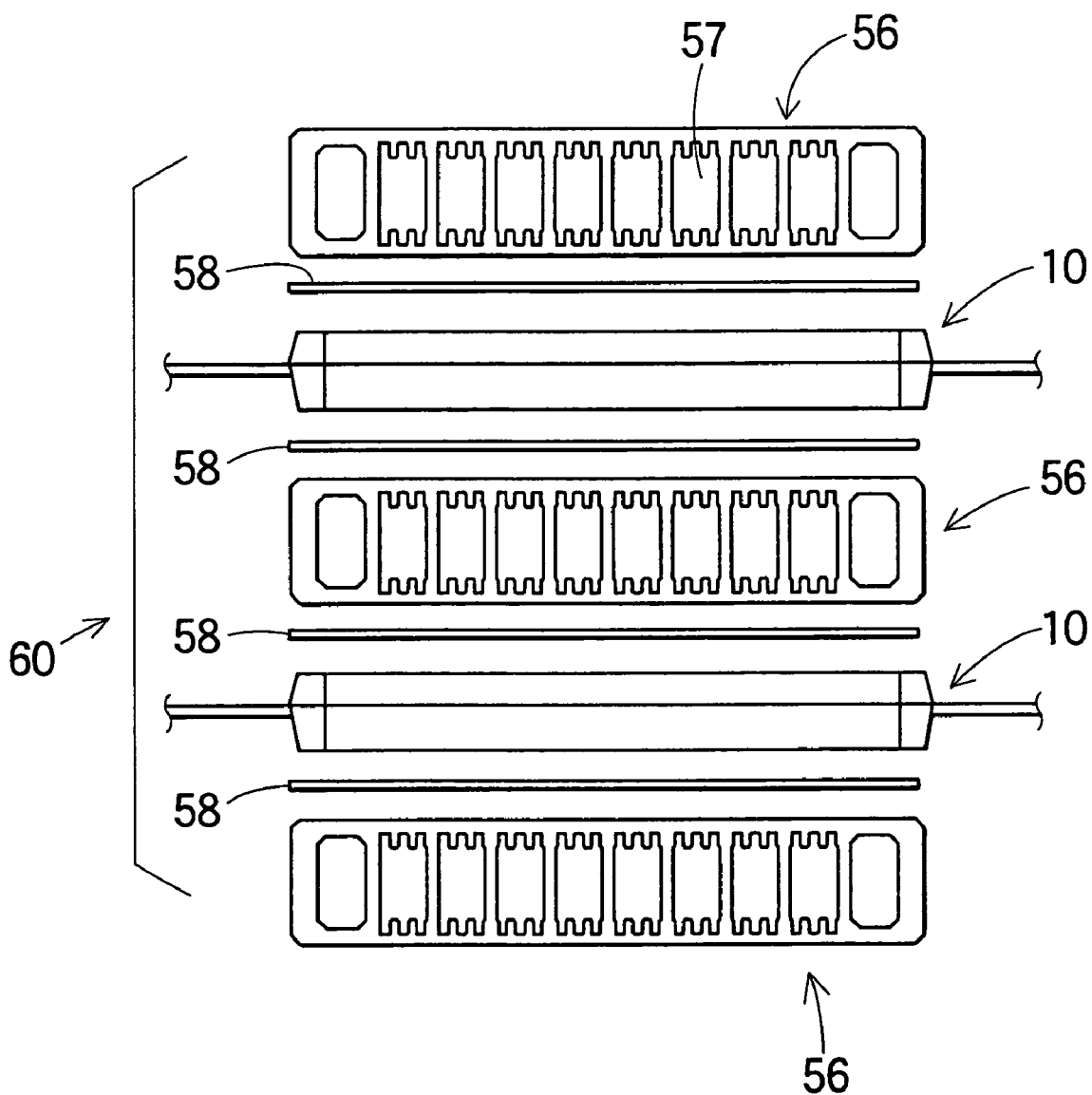
FIG. 5 is a cross-sectional view showing a power stuck, according to the first embodiment.

As shown in FIG. 5, a power stack 60 includes a plurality of semiconductor modules 10 and cooling tubes 56. The cooling tubes 56 have a thin (i.e., flat) rectangular cross section, and extend toward a direction perpendicular to the drawing. The cooling tube 56 includes a plurality of coolant passages 57 for passing the coolant therethrough. Each coolant passage 57 is arranged side by side and disposed parallel each other.

A plurality of semiconductor modules 10 are cooled with a plurality of cooling tubes 56 through an insulation plate 58, which electrically insulates the semiconductor modules 10 from the cooling tubes 56. Specifically, each semiconductor module 10 is sandwiched by a pair of insulation plates 58 and a pair of cooling tubes 56. Here, the extrusion of the collector electrode 13 is perpendicular to the longitudinal direction of the cooling tube 56. Thus, in this embodiment, the lower cooling tube 56, the insulation plate 58, the semiconductor module 10, the plate 58, the intermediate cooling tube 56, the plate 58, the module 10, the plate 58 and the upper cooling tube 56 are arranged in this order, as shown in FIG. 5. However, more modules 10, plates 58 and tubes 56 can be arranged in the stack.

A pair of spacers (not shown) is disposed on both ends in the longitudinal direction of the cooling tube 56. The stack 60 is pressed so that thermal resistance at each contact surface is reduced. Therefore, the semiconductor modules 10 and the cooling tubes 56 with the insulation plates 58 are integrated together, so that the stack 60 is completed.

Here, the stack 60 having the semiconductor module 10 is incorporated to an inverter to convert direct current to alternating current with using a well-known method. This stack 60 according to the first embodiment has following advantages.

When the module 10 is operated and heat is generated in the module 10, the module 10 is cooled with the cooling tube 56 so that the temperature increase of the module 10 is suppressed. Specifically, each module 10 is sandwiched with a pair of cooling tubes 57. The upper and lower surfaces of the module 10 contact the cooling tubes 57, respectively. Specifically, the body 12 of the lower electrode plate 11 of the module 10 and the body 26 of the upper electrode plate 25 of the module 10, which are exposed on the upper and lower surfaces of the module 10, contact the cooling tubes 56, respectively. Thus, the upper and lower surface of the module 10 are cooled with the cooling tubes 56, i.e., the coolant in the cooling tube 56, so that the temperature increase of the module 10 is suppressed. Therefore, an excellent cooling performance is achieved.

If the module 10 works in anomalous operation where excess heat is generated in the module 10, then the inner pressure in the module 10 increases, the excess inner pressure is released. Thus, the module 10 is protected from being broken. Specifically, if anomaly happens in the semiconductor chip 17 (e.g., if an excess current flows in the chip 17, the excess current being larger than the permissible current of the chip 17), extreme heat is generated in the chip 17. Then, the resin mold 30 disposed around the chip 17 is melted and vaporized by the excess heat, so that the inner pressure in the module 30 around the chip 17 is increased. The excess inner pressure extrudes the resin rods 45–47 to the outside of the module 10. In a case where the above extrusive force is comparatively small, the resin rods 45–47 only strip off from the resin mold 30. Specifically, the resin rods 45–47 separate from an inner wall of the hole in the resin mold 30, in which the resin rods 45–47 are embedded. In this case, the resin rods 45–47 do not drop out of the hole completely, but only moves toward the outside of the resin mold 30. Then, the excess inner pressure is released to the outside of the module 10 through a clearance between the resin rods 45–47 and the inner wall of the hole, so that the inner pressure in the module 10 is reduced.

On the other hand, in a case where the extrusive force is comparatively large,-the resin rods 45–47 are pushed out of the module 10. Therefore, the excess inner pressure is released to the outside of the module 10 through the hole.

The first, the second and the third resin rods 45–47 extend toward three directions, which are different one another. Therefore, even if only one of the portions 32a, 32b, 33a and/or the portions 36a, 36b, 37a of the resin mold 30 is melted, the excess inner pressure is released sufficiently.

Further, the resin mold 30 is melted and vaporized by the excess heat, so that the inner pressure in the module 30 around the second semiconductor chip 20 is increased. The excess inner pressure extrudes the fourth, the fifth and/or the sixth resin rods 51–53 to the outside of the module 10. In a case where the above extrusive force is comparatively small, the resin rods 51–53 only strip off from an inner wall of a hole of the resin mold 30, in which the resin rods 51–53 are embedded. In this case, the resin rods 51–53 do not come out of the hole completely, but only moves toward the outside of the resin mold 30. Then, the excess inner pressure is released to the outside of the module 10 through a clearance between the resin rods 51–53 and the inner wall of the hole, so that the inner pressure in the module 10 is reduced.

On the other hand, in a case where the extrusive force is comparatively large, the resin rods 51–53 are pushed out of the module 10. Therefore, the excess inner pressure is released to the outside of the module 10 through the hole.

Thus, the module 10 has a safety feature for preventing an extreme increase of the pressure inside the module 10.

Further, the resin rods 45–47, 51–53 can be formed easily, and each resin rod 45–47, 51–53 is thin, therefore the manufacturing cost of the resin rods 45–47, 51–53 is comparatively small. Furthermore, it is not required to change the manufacturing process of the module 10 substantially even if the resin rods 45–47, 51–53 are additionally formed in the module 10. Further, the resin rods 45–47, 51–53 do not affect thermal contact between the module 10 and the cooling tube 56.

Further, the semiconductor module 10 is prevented from burst or explosion by the excess inner pressure, therefore a piece of the resin mold 30 does not scatter around the module 10, which in turn damage other parts of the equipment. Specifically, a secondary damage arising from a scattering of the piece is prevented.

(Second Embodiment)

Figure 6:
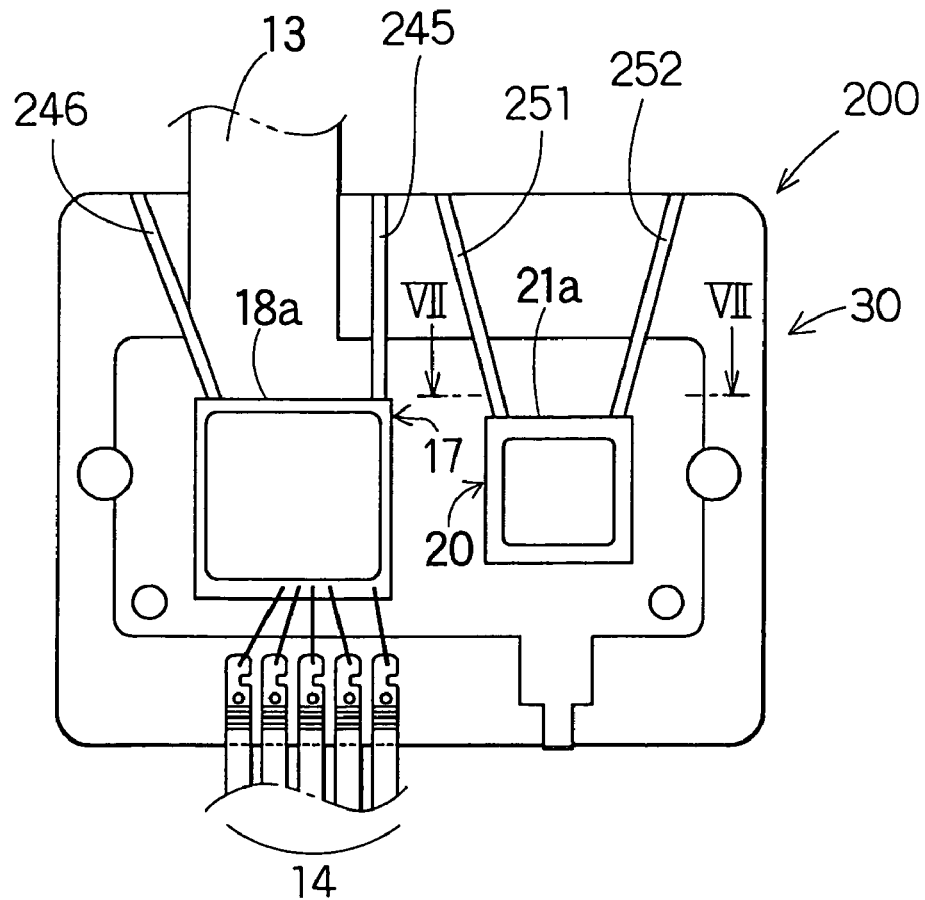
FIG. 6 is a cross-sectional view showing a semiconductor module according to a second embodiment of the present invention.
Figure 7:
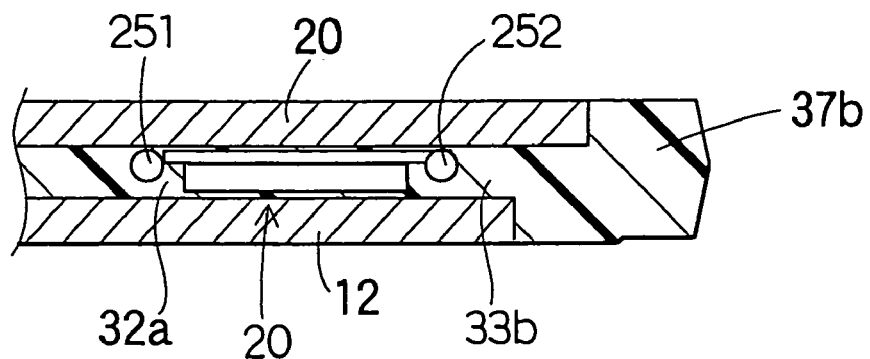
FIG. 7 is a partial cross-sectional view showing the module cut along the line VII—VII in FIG. 6.

A semiconductor module 200 according to a second embodiment of the present invention is shown in FIGS. 6 and 7. The module 200 has the first resin rod 245, the second resin rod 246, the third rod 251, and the fourth rod 252. The first resin rod 245 extends from the one periphery 18a of the first semiconductor chip 17 to the outer periphery of the resin mold 30. The second resin rod 246 extends from the one periphery 18a of the first semiconductor chip 17 to an oblique direction, which slants and detaches from the first resin rod 245.

On the other hand, the third resin rod 251 extends from the one periphery 21a of the second semiconductor chip 20 to the outer periphery of the resin mold 30. The third resin rod 251 slants toward the first resin rod 245. The fourth resin rod 252 extends from the one periphery 21a of the second semiconductor chip 20 to an oblique direction, which slants and detaches from the third resin rod 251.

Thus, all of the resin rods 245, 246, 251, 252 are disposed on the collector electrode 13 side and the emitter electrode 27 side of the module 200. This is because each of the collector and emitter electrodes 13, 27 has a simple construction and large mechanical strength in comparison with the terminal 14. The terminal 14 has a plurality of thin pins, each of which connects to a control circuit board (not shown). A plurality of electric parts are mounted on the control circuit board at a comparatively short distance between the parts. Therefore, if the excess inner pressure is released at the terminal 14 side, the terminal 14 may be deformed or destroyed, therefore a scattered piece of the resin rods 245, 246, 251, 252 may attach to other electric parts in case of the resin rods 245, 246, 251, 252 coming out of the resin mold 30. Thus, if the resin rods 245, 246, 251, 252 would be disposed on the terminal 14 side so that the excess inner pressure is released to the terminal 14 side, the semiconductor chips 17, 20 may malfunction.

On the other hand, each of the collector and emitter electrodes 13, 27 has a rectangular plate shape, and large mechanical strength, so that the electrodes 13, 27 are not deformed substantially in a case where the excess inner pressure is released at the electrodes 13, 27 sides. Further, the electrodes 13, 27 are disposed at a predetermined distance therebetween so that one electrode 13, 27 is electrically isolated from the other electrode 13, 27. Therefore, if the scattered piece of the resin mold 30 attaches to the electrodes 13, 27, the chips 17, 20 do not malfunction.

Thus, the module 200 has a safety feature for limiting an extreme increase of the inner pressure inside the module 200.

(Third Embodiment)

Figure 8:
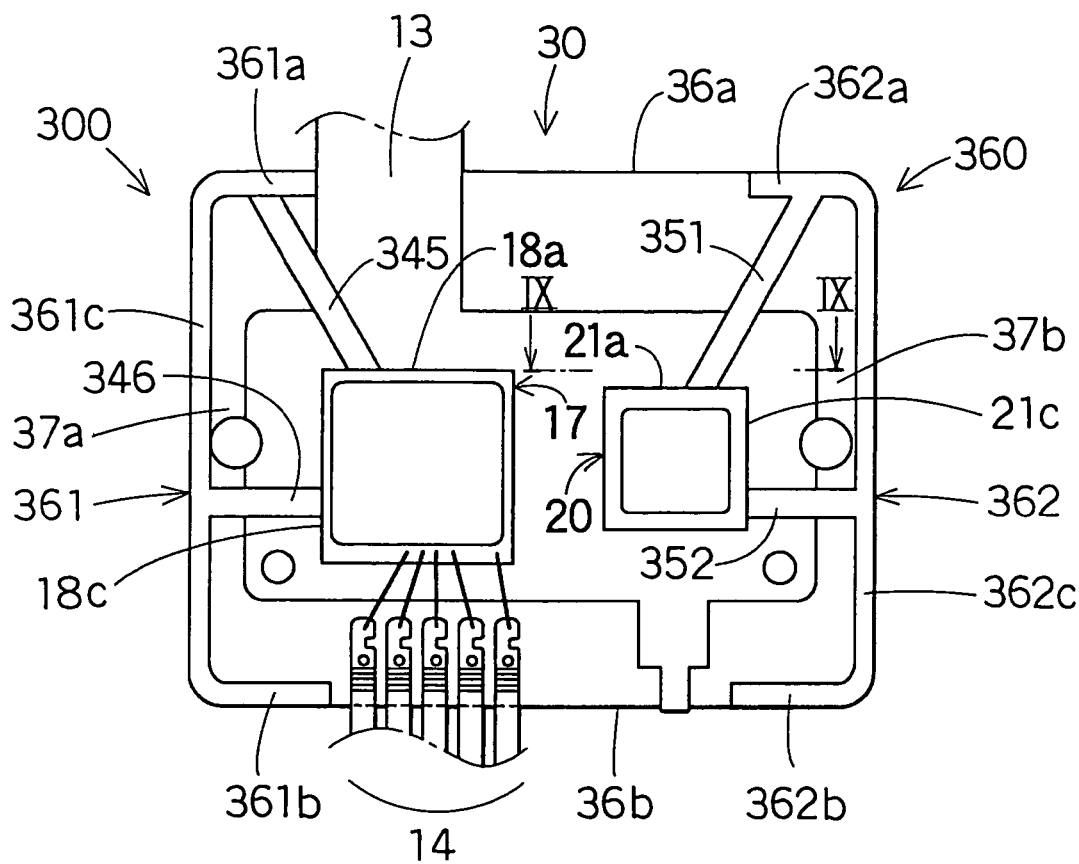
FIG. 8 is a cross-sectional view showing a semiconductor module according to a third embodiment of the present invention.
Figure 9:
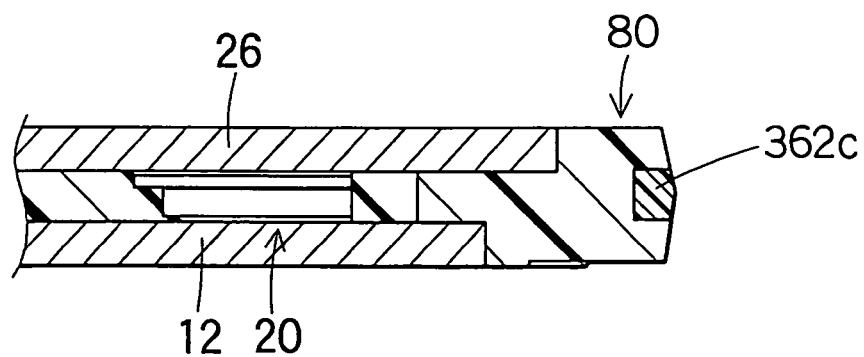
FIG. 9 is a partial cross-sectional view showing the module cut along the line IX—IX in FIG. 8.

A semiconductor module 300 according to a third embodiment of the present invention is shown in FIGS. 8 and 9. The module 300 includes a support portion 360, which is disposed on a periphery of the resin mold 30. The support portion 360 has a frame shape, and is integrated with a plurality of resin rods 345, 345, 351, 352. The support portion 360 includes the first support portion 361 having an electrode side portion 361a, a terminal side portion 361b and a main portion 361c and the second support portion 362 having an electrode side portion 362a, a terminal side portion 362b and a main portion 362c.

The electrode side portion 361a of the first support portion 361 is disposed on part of the portion 36a of the collector electrode 13 side of the resin mold 30, and the electrode side portion 362a of the second support portion 362 is disposed on another part of the portion 36a of the collector electrode 13 side of the resin mold 30. The terminal side portion 361b of the first support portion 361 is disposed on part of the portion 36b of the terminal 14 side of the resin mold 30, and the terminal side portion 362b of the second support portion 362 is disposed on another part of the portion 36b of the terminal 14 side of the resin mold 30. The main portion 361c of the first support portion 361 is disposed on the whole periphery of the portion 37a of the first semiconductor chip 17 side of the resin mold 30, and the terminal side portion 362c of the second support portion 362 is disposed on the whole periphery of the portion 37b of the second semiconductor chip 20 side of the resin mold 30.

The module 300 has the first resin rod 345, the second resin rod 346, the third rod 351, and the fourth rod 352. The first resin rod 345 extends slantwise from the one periphery 18a of the first semiconductor chip 17 to the outer periphery of the resin mold 30 so that the first resin rod 345 connects to the electrode side portion 361a of the first support portion 361. Specifically, the first resin rod 345 extends from one end of the periphery 18a of the first semiconductor chip 17. The second resin rod 346 extends from the one periphery 18c of the first semiconductor chip 17 to the outer periphery of the portion 37a of the resin mold 30 so that the second resin rod 346 connects to the main portion 361c of the first support portion 361. Specifically, the second resin rod 346 extends from the middle of the periphery 18c of the first semiconductor chip 17. The first and second resin rods 345, 346 and the first support portion 361 are made of the same resin material, and integrated together.

The third resin rod 351 extends slantwise from the one periphery 21a of the second semiconductor chip 20 to the outer periphery of the resin mold 30 so that the third resin rod 351 connects to the electrode side portion 362a of the second support portion 362. Specifically, the third resin rod 351 extends from the middle of the periphery 21a of the second semiconductor chip 20. The fourth resin rod 352 extends from the one periphery 21c of the second semiconductor chip 20 to the outer periphery of the portion 37b of the resin mold 30 so that the fourth resin rod 352 connects to the main portion 362c of the second support portion 362. Specifically, the fourth resin rod 346 extends from one end of the periphery 21c of the second semiconductor chip 20. The third and the fourth resin rods 351, 352 and the second support portion 362 are made of the same resin material, and integrated together.

The excess inner pressure around the first and the second semiconductor chips 17, 20 is released to the outside of the module 300 through a clearance between the resin rods 345, 346, 351, 352 and the inner wall of the hole of the resin mold 30, in which the resin rods 345, 346, 351, 352 are embedded, or through the hole itself. The hole of the resin mold 30 is formed after the resin rods 345, 346, 351, 352 come out of the resin mold 30. Thus, the excess inner pressure in the module 300 is reduced.

Further, when the upper and lower electrode plates 11, 25, i.e., the bodies 12, 26 of the electrode plates 11, 25, are pressed to the first and the second semiconductor chips 17, 20 in the manufacturing of the resin mold 30, the bodies 12, 26 of the upper and lower electrode plates 11, 25 are prevented from being deformed. Specifically, when the distance between the upper and lower electrode plates 11, 25 is equal to or larger than a predetermined distance when soldering the upper and lower electrode plates 11, 25, the support portion 360 holds a part of the pressure applied between the upper and lower electrode plates 11, 25. Thus, the deformation of the electrode plates 11, 25 is prevented. When the distance between the upper and lower electrode plates 11, 25 is smaller than the predetermined distance when soldering the upper and lower electrode plates 11, 25, the support portion 360 prevents the excess deformation of the electrode plates 11, 25. Thus, a clearance between the electrode plates 11, 25 and a molding die (not shown) is sealed with the support portion 360.

If the resin mold 30 has no support portion 360, the first and the second semiconductor chips 17, 20 may be damaged by the excess pressure applied with the molding die when the distance between the upper and lower electrode plates 11, 25 is equal to or larger than the predetermined distance. On the other hand, in a case where the distance between the upper and lower electrode plates 11, 25 is smaller than the predetermined distance, the clearance is left between the upper or lower electrode plate 11, 25 and the molding die is formed, therefore the resin material is inserted into the clearance. Then, the resin material in the clearance forms a resin film on the electrode plate 11, 25, i.e., the body 12, 26 of the electrode plate 11, 25, therefore the heat dissipation capability of the electrode plate 11, 25 is reduced.

Thus, the module 300 has a safety feature for limiting an extreme increase of the pressure inside the module 300. Further, the cooling efficiency is much improved.

(Fourth Embodiment)

Figure 10:
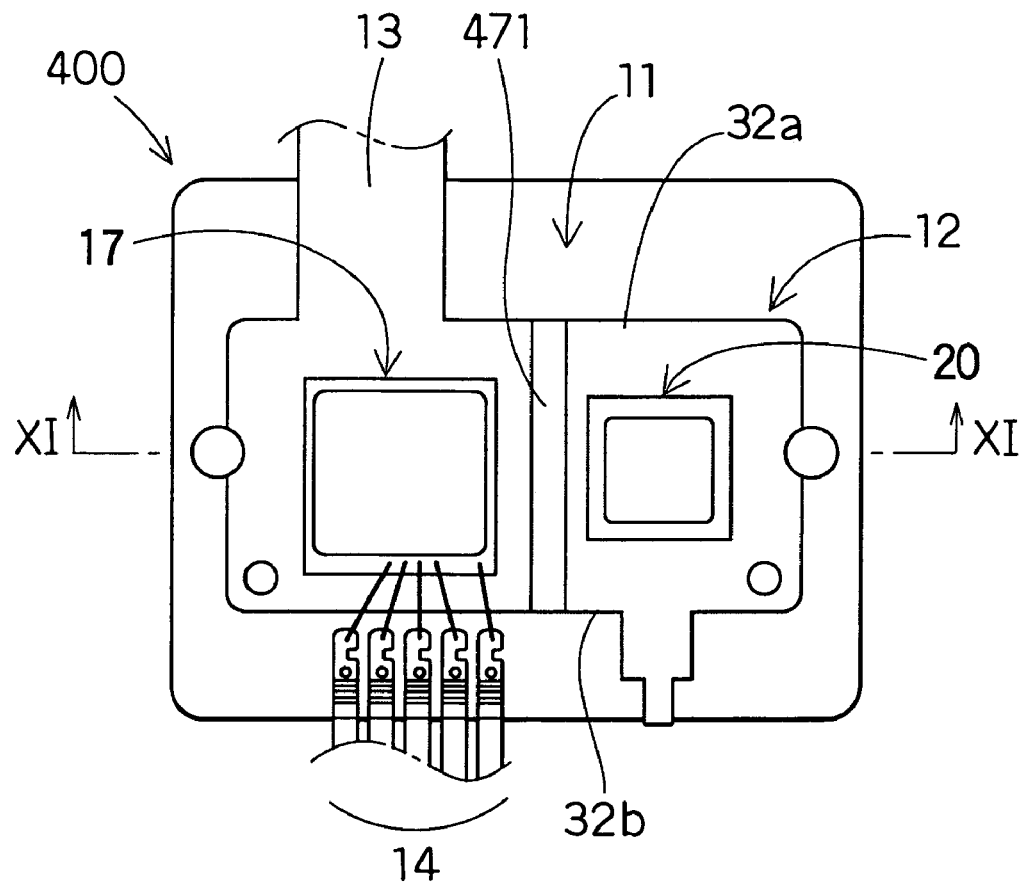
FIG. 10 is a cross-sectional view showing a semiconductor module according to a fourth embodiment of the present invention.
Figure 11:
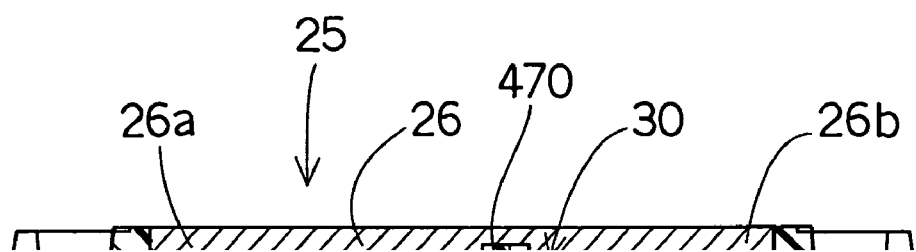
FIG. 11 is a partial cross-sectional view showing the module cut along the line XI—XI in FIG. 10.

A semiconductor module 400 according to a fourth embodiment of the present invention is shown in FIGS. 10 and 11. The module 400 includes a pair of grooves 470, 471 as a deformation starter for releasing the inner pressure. The deformation starter is a weak point for the electrode plates 11, 25 to deform. Each groove 470, 471 is disposed on the body 12, 26 of the electrode plate 11, 25. Specifically, a lower groove 471 is disposed on the upper surface of the body 12 of the lower electrode plate 11 between the first and the second semiconductor chips 17, 20. The lower groove 471 having a rectangular cross-section traverses from the portion 32a of the collector electrode 13 side of the resin mold 30 to the portion 32b of the terminal 14 side of the resin mold 30. The upper groove 470 is disposed on the lower surface of the body 26 of the upper electrode plate 25 between the first and the second semiconductor chips 17, 20. The upper groove 470 having a rectangular cross-section traverses from the portion 32a of the collector electrode 13 side of the resin mold 30 to the portion 32b of the terminal 14 side of the resin mold 30, therefore the upper groove 470 faces the lower groove 471. The upper and lower grooves 470, 471 do not overlap the first and the second semiconductor chips 17, 20.

When the inner pressure around the first and/or the second semiconductor chips 17, 20 rises significantly, the first and/or the second electrode plate 17, 20 deforms at the upper and/or lower groove 470, 471 as a starting point. Specifically for the upper electrode plate 25, the middle portion having the upper groove 470 is weak, while side portions 26a, 26b have a large mechanical strength. Similarly for the lower electrode plate 11, the middle portion having the lower groove 471 is weak, while side portions 12a, 12b have a larger mechanical strength.

The one side portion 26a and/or the other side portion 26b of the upper electrode plate 25 deform upward, and the one side portion 12a and/or the other side portion 12b of the lower electrode plate 11 deform downward. Thus, a clearance is formed between the one side portion 26a or the other side portion 26b of the upper electrode plate 25 and the resin mold 30. Further, another clearance is formed between the one side portion 12a or the other side portion 12b of the lower electrode plate 11 and the resin mold 30. These clearances release the excess inner pressure in the resin mold 30. Thus, the module 400 has a safety feature for preventing an extreme increase of the pressure inside the module 400.

(Fifth Embodiment)

Figure 12:
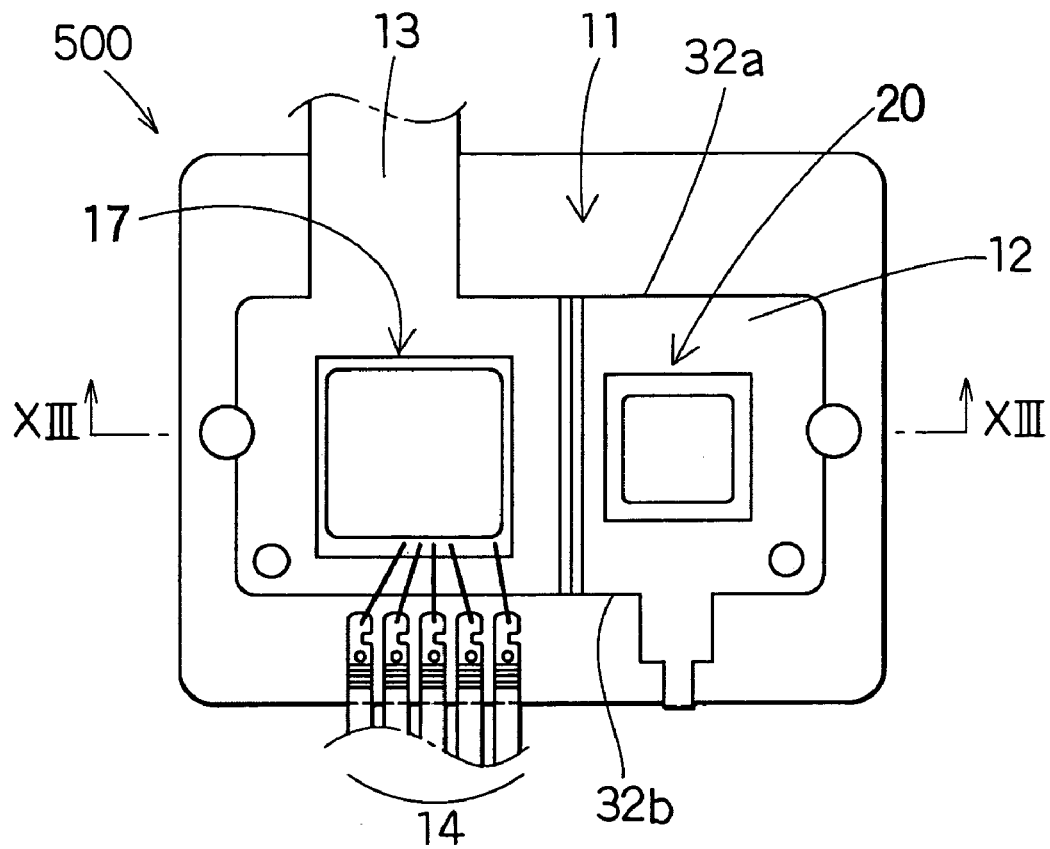
FIG. 12 is a cross-sectional view showing a semiconductor module according to a fifth embodiment of the present invention.
Figure 13:
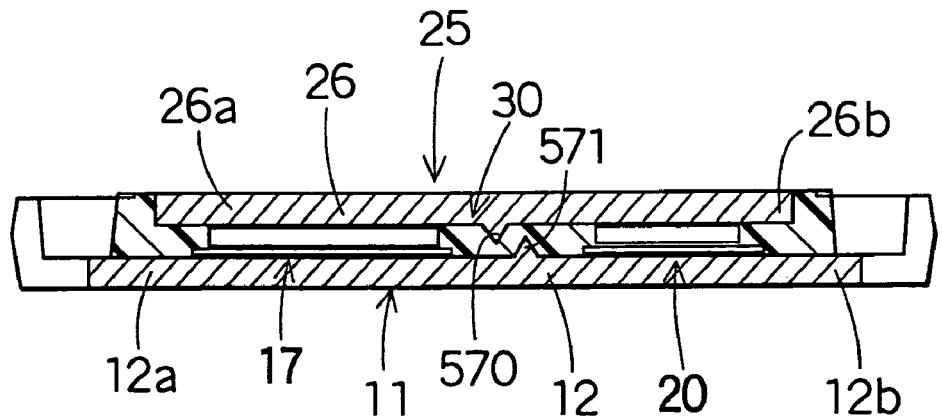
FIG. 13 is a partial cross-sectional view showing the module cut along the line XIII—XIII in FIG. 12.

A semiconductor module 500 according to a fifth embodiment of the present invention is shown in FIGS. 12 and 13. The module 500 includes a pair of protrusions (i.e., ridges) 570, 571 as a deformation starter for releasing the inner pressure. Each protrusion 570, 571 is disposed on the body 12, 26 of the electrode plate 11, 25. Specifically for the lower electrode plate 11, a lower protrusion 571 is disposed on the upper surface of the body 12 between the first and the second semiconductor chips 17, 20. The lower protrusion 571 having a triangular cross-section traverses from the portion 32a of the collector electrode 13 side of the resin mold 30 to the portion 32b of the terminal 14 side of the resin mold 30. For the upper electrode plate 25, the upper protrusion 570 is disposed on the lower surface of the body 26 between the first and the second semiconductor chips 17, 20. The upper protrusion 570 having a triangular cross-section traverses from the portion 32a of the collector electrode 13 side of the resin mold 30 to the portion 32b of the terminal 14 side of the resin mold 30. The upper protrusion 570 is separated from the lower protrusion 571 by a predetermined distance, and is parallel to the lower protrusion 571.

When the inner pressure around the first and/or the second semiconductor chips 17, 20, the first and/or the second electrode plate 17, 20 deforms the base of the triangular at the upper and/or lower protrusion 570, 571 due to stress concentration. Specifically, the one side portion 26a and the other side portion 26b of the upper electrode plate 25 deform upward, and the one side portion 12a and the other side portion 12b of the lower electrode plate 11 deform downward. Thus, a clearance is formed between the one side portion 26a and the other side portion 26b of the upper electrode plate 25 and the resin mold 30. Further, another clearance is formed between the one side portion 12a and the other side portion 12b of the lower electrode plate 11 and the resin mold 30. These clearances release the excess inner pressure in the resin mold 30. Thus, the module 500 has a safety feature for preventing an extreme increase of the inner pressure inside the module 500.

Such changes and modifications are to be understood as being within the scope of the present invention as defined by the appended claims.

What is claimed is:

1. A semiconductor module comprising:
a semiconductor chip having a first surface and a second surface;
a first electrode plate contacting the first surface of the semiconductor chip;
a second electrode plate contacting the second surface of the semiconductor chip; and
a resin mold for sealing the first and second electrode plates and the semiconductor chip, wherein:
the resin mold includes an inner pressure release portion that passes from an interior of the resin mold to an exterior of the resin mold for releasing an inner pressure in the resin mold, and the resin mold seals a surface of the semiconductor chip, and
wherein the inner pressure release portion is provided by a hole, which extends from the surface of the semiconductor chip to outside of the resin mold.

2. The module according to claim 1,
wherein the first electrode plate includes a first electrode and a signal terminal, which protrude from the resin mold, and
wherein the second electrode plate includes a second electrode, which protrudes from the resin mold.

3. The module according to claim 1,
wherein the inner pressure rises in the resin mold in a case when a temperature of the semiconductor chip increases.

4. The module according to claim 1,
wherein the first electrode plate includes a body, which is exposed outside of the resin mold, and
wherein the second electrode plate includes a body, which is exposed outside of the resin mold.

5. The module according to claim 1,
wherein the semiconductor chip is sandwiched by the first and second electrode plates, and embedded in the resin mold.

6. The module according to claim 1,
wherein the inner pressure release portion is made of resin material having low adhesiveness to the resin mold, and
wherein the inner pressure release portion is a resin rod embedded in the resin mold.

7. The module according to claim 6,
wherein the resin rod extends from a surface of the semiconductor chip to outside of the resin mold.

8. The module according to claim 7,
wherein the resin mold includes a hole,
wherein the resin rod is inserted into the hole of the resin mold, and
wherein the resin rod is removable from the hole so that a clearance is formed between the resin rod and the hole.

9. The module according to claim 8,
wherein the inner pressure release portion works in such a manner that the inner pressure in the resin mold is released through the clearance between the resin rod and the hole.

10. The module according to claim 8,
wherein the resin rod is capable of being pushed out of the hole.

11. The module according to claim 10,
wherein the inner pressure release portion works in such a manner that the inner pressure in the resin mold is released through the hole after the resin rod drops out of the hole.

12. A semiconductor module comprising:
a semiconductor chip having a first surface and a second surface;
a first electrode plate contacting the first surface of the semiconductor chip;
a second electrode plate contacting the second surface of the semiconductor chip; and
a resin mold for sealing the first and second electrode plates and the semiconductor chip, wherein:
each of the first and second electrode plates includes an inner pressure release portion that passes from an interior of the resin mold to an exterior of the resin mold for releasing an inner pressure in the resin mold, and
the resin mold seals a surface of the semiconductor chip, and wherein the inner pressure release portion is provided by a groove, which extends from the surface of the semiconductor chip to outside of the resin mold.

13. The module according to claim 12,
wherein the first electrode plate includes a first electrode and a signal terminal, which protrude from the resin mold, and
wherein the second electrode plate includes a second electrode, which protrudes from the resin mold.

14. The module according to claim 12,
wherein the inner pressure arises in the resin mold in a case where the semiconductor chip works in abnormal operations.

15. The module according to claim 12,
wherein the first electrode plate includes a body, which is exposed outside of the resin mold, and
wherein the second electrode plate includes a body, which is exposed outside of the resin mold.

16. The module according to claim 12,
wherein the semiconductor chip is sandwiched by the first and second electrode plates, and embedded in the resin mold.

17. The module according to claim 12,
wherein the inner pressure release portion is a starting point for deforming the first and second electrode plates so that the inner pressure is released.

18. The module according to claim 17,
wherein the starting point does not overlap the semiconductor chips.

19. The module according to claim 17,
wherein each of the first and second electrode plates includes the starting point and an other portion, and
wherein the other portion is deformable so that a clearance is formed between the other portion and the resin mold.

20. The module according to claim 19,
wherein the inner pressure release portion works in such a manner that the inner pressure in the resin mold is released through the clearance.

21. The module according to claim 17,
wherein the inner pressure release portion is a concavity or a convexity for deforming the first and second electrode plates so that the inner pressure is released.

* * * * *